United States Patent
Fulford, Jr. et al.

[19]

[11] Patent Number: 6,104,063
[45] Date of Patent: *Aug. 15, 2000

[54] MULTIPLE SPACER FORMATION/ REMOVAL TECHNIQUE FOR FORMING A GRADED JUNCTION

[75] Inventors: H. Jim Fulford, Jr., Austin; Mark I. Gardner, Cedar Creek; Derick J. Wristers, Austin, all of Tex.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/942,998

[22] Filed: Oct. 2, 1997

Related U.S. Application Data

[62] Division of application No. 08/761,398, Dec. 6, 1996, Pat. No. 5,766,969.

[51] Int. Cl.$^7$ .......................... H01L 29/76; H01L 27/088
[52] U.S. Cl. .......................... 257/344; 257/336; 257/408; 257/900
[58] Field of Search ...................................... 257/408, 344, 257/336, 337, 900; 438/302–305, 595, 596

[56] References Cited

U.S. PATENT DOCUMENTS

| | | |
|---|---|---|
| 4,172,260 | 10/1979 | Okabe et al. . |
| 4,356,623 | 11/1982 | Hunter . |
| 4,638,347 | 1/1987 | Iyer ........................................ 257/900 |
| 4,818,715 | 4/1989 | Chao . |
| 4,843,023 | 6/1989 | Chiu et al. . |
| 4,925,807 | 5/1990 | Yoshikawa ................................ 437/44 |
| 4,949,136 | 8/1990 | Jain . |
| 4,971,922 | 11/1990 | Watabe et al. ........................... 257/408 |
| 5,015,598 | 5/1991 | Verhaar ................................... 257/408 |
| 5,023,190 | 6/1991 | Lee et al. . |
| 5,091,763 | 2/1992 | Sanchez . |

(List continued on next page.)

FOREIGN PATENT DOCUMENTS

| | | |
|---|---|---|
| 2-280342 | 11/1990 | Japan . |
| 4-208571 | 7/1992 | Japan . |
| 5-267327 | 10/1993 | Japan . |

OTHER PUBLICATIONS

Wolf et al., *Silicon Processing for the VLSI Era, vol. 1: Process Technology*, Lattice Press 1986, pp. 183 and 321–323.

*Primary Examiner*—Tom Thomas
*Assistant Examiner*—Ori Nadav
*Attorney, Agent, or Firm*—Kevin L. Daffer; Conley, Rose & Tayon

[57] ABSTRACT

A transistor and a transistor fabrication method are presented where a sequence of spacers are formed and partially removed upon sidewall surfaces of the gate conductor to produce a graded junction having a relatively smooth doping profile. The spacers include removable and non-removable structures formed on the sidewall surfaces. The adjacent structures have dissimilar etch characteristics compared to each other and compared to the gate conductor. A first dopant (MDD dopant) and a second dopant (source/drain dopant) are implanted into the semiconductor substrate after the respective formation of the removable structure and the non-removable structure. A third dopant (LDD dopant) is implanted into the semiconductor substrate after the removable layer is removed from between the gate conductor and the non-removable structure (spacer). As a result a graded junction is created having higher concentration regions formed outside of lightly concentration regions, relative to the channel area. Such a doping profile provides superior protection against the hot-carrier effect compared to the traditional LDD structure. The smoother the doping profile, the more gradual the voltage drop across the channel/drain junction. A more gradual voltage drop gives rise to a smaller electric field and reduces the hot-carrier effect. Furthermore, the MDD and source/drain implants are performed first, prior to the LDD implant. This allows high-temperature thermal anneals to be performed first, followed by lower temperature anneals second.

19 Claims, 3 Drawing Sheets

U.S. PATENT DOCUMENTS

| | | |
|---|---|---|
| 5,153,145 | 10/1992 | Lee et al. . |
| 5,168,072 | 12/1992 | Moslehi . |
| 5,221,632 | 6/1993 | Kurimoto et al. . |
| 5,241,203 | 8/1993 | Hsu et al. . |
| 5,278,441 | 1/1994 | Kang et al. . |
| 5,405,791 | 4/1995 | Ahmad et al. . |
| 5,422,506 | 6/1995 | Zamapian ................................ 257/408 |
| 5,424,234 | 6/1995 | Kwon . |
| 5,444,282 | 8/1995 | Yamaguchi et al. . |
| 5,498,555 | 3/1996 | Lin . |
| 5,501,997 | 3/1996 | Lin et al. . |
| 5,512,771 | 4/1996 | Hiroki et al. . |
| 5,602,045 | 2/1997 | Kimura . |
| 5,654,212 | 8/1997 | Jang . |
| 5,663,586 | 9/1997 | Lin . |
| 5,677,224 | 10/1997 | Kadosh et al. . |
| 5,719,425 | 2/1998 | Akram et al. ............................ 257/408 |
| 5,757,045 | 5/1998 | Tsai et al. . |
| 5,776,825 | 7/1998 | Suganaga et al. ....................... 438/618 |
| 5,783,475 | 7/1998 | Ramaswami ............................ 438/303 |
| 5,793,089 | 8/1998 | Fulford, Jr. et al. . |
| 5,837,572 | 11/1998 | Gardner et al. . |
| 5,846,857 | 12/1998 | Ju . |
| 5,869,866 | 2/1999 | Fulford, Jr. et al. . |
| 5,869,879 | 2/1999 | Fulford, Jr. et al. . |
| 5,882,973 | 3/1999 | Gardner et al. . |

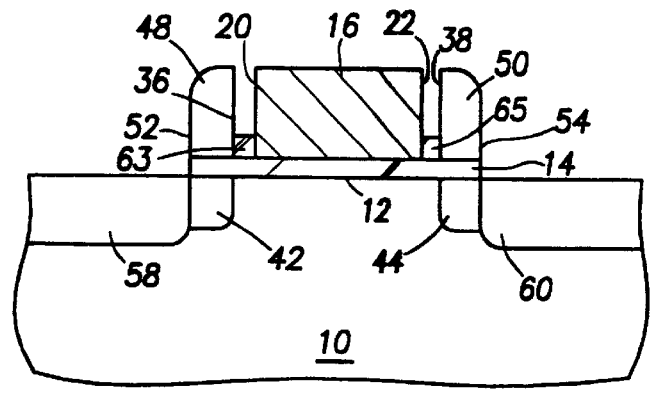
FIG.7
FIG.8
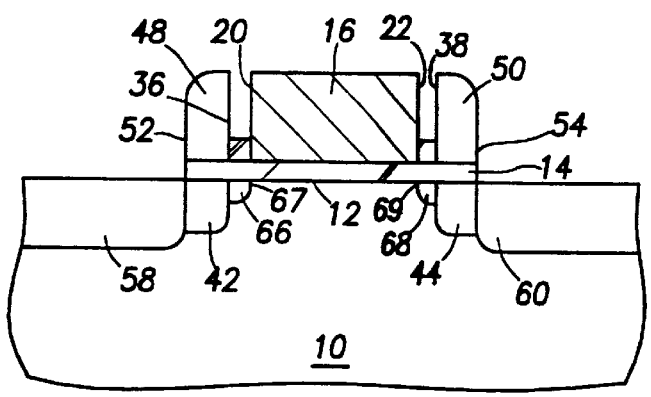
FIG.9
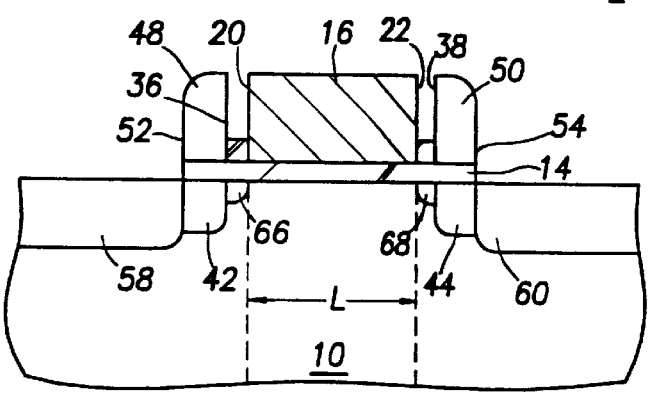

MULTIPLE SPACER FORMATION/ REMOVAL TECHNIQUE FOR FORMING A GRADED JUNCTION

This is a Division of application Ser. No. 08/761,398, filed Dec. 6, 1996 now U.S. Pat. No. 5,766,969.

BACKGROUND OF THE INVENTION

1. Field of the Invention

This invention relates to semiconductor processing and, more particularly, to a method of forming and removing multiple spacers upon and from, respectively, sidewall surfaces of a gate conductor for the purpose of producing a graded junction.

2. Description of Relevant Art

Fabrication of a metal-oxide-semiconductor ("MOS") transistor is well-known. Fabrication begins by lightly doping a single crystal silicon substrate n-type or p-type. The specific area where the transistor will be formed is then isolated from other areas on the substrate using various isolation structures. In modern fabrication technologies, the isolation structures may comprise shallow trenches in the substrate filled with dielectric oxide which acts as an insulator. Isolation structures may alternatively comprise, for example, locally oxidized silicon ("LOCOS") structures. A gate dielectric is then formed by oxidizing the silicon substrate. Oxidation is generally performed in a thermal oxidation furnace or, alternatively, in a rapid-thermal-anneal ("RTA") apparatus. A gate conductor is then patterned using a photolithography mask from a layer of polycrystalline silicon ("polysilicon") deposited upon the gate dielectric. The mask allows select removal of a light-sensitive material deposited entirely across polysilicon. The material which is exposed can, according to one embodiment, be polymerized, and that which is not exposed removed. Selective polymerization is often referred to as the "develop" stage of lithography. The regions which are non-polymerized are removed using the etch stage of lithography.

The polysilicon is rendered conductive with the introduction of ions from an implanter or a diffusion furnace. The gate conductor is patterned using a mask followed by exposure, development, and etching. Subsequently, source and drain regions are doped, via ion implantation, with a high dosage n-type or p-type dopant. If the source and drain regions are doped n-type, the transistor is referred to as NMOS, and if the source and drain regions are doped p-type, the transistor is referred to as PMOS. A channel region between the source and the drain is protected from the implant species by the pre-existing gate conductor. When voltage above a certain threshold is applied to the gate of an enhancement-mode transistor, the channel between the source and drain becomes conductive and the transistor turns on.

As device dimensions are reduced while supply voltages remain constant (or are not reduced as rapidly as the structures are scaled), the maximum electric field $E_m$ becomes more isolated near the drain side of the channel causing accelerated inversion-layer charges (or carriers) to enter into the overlying gate oxide. The carriers become trapped in the gate dielectric, a phenomenon generally called the hot-carrier effect. The injection of hot carriers into the gate dielectric damages the substrate/gate dielectric interface. Over time, operational characteristics of the device may degrade due to this damage, that degradation resulting in, e.g., improper variation of threshold voltage, linear region transconductance, subthreshold slope, and saturation current. This may eventually reduce the lifetime of the devices.

Reducing the maximum electric field $E_m$ in the drain-side of the channel is a popular way to control the hot-carrier effect. A common approach to reducing $E_m$ is to minimize the abruptness in voltage changes near the drain side of the channel. Disbursing abrupt voltage changes reduces $E_m$ strength and the harmful hot-carrier effects resulting therefrom. Reducing $E_m$ occurs by replacing an abrupt drain doping profile with a more gradually varying doping profile. A more gradual doping profile distributes $E_m$ along a larger lateral distance so that the voltage drop is shared by the channel and the drain. Absent a gradual doping profile, an abrupt junction can exist where almost all of the voltage drop occurs across the lightly-doped channel. The smoother the doping profile, the smaller $E_m$ is.

The simplest method to obtain a gradual doping at the drain-side channel is to use a dopant with a high diffusivity, for example, phosphorus instead of arsenic for an n-channel device. The faster-diffusing phosphorus readily migrates from its implant position in the drain toward the channel creating a gradually doped drain and consequently a smoother voltage profile. Unfortunately, however, the high diffusivity of phosphorus, in addition to creating a gradual lateral doping profile, also increases the lateral and vertical extents of the junction. Enlarging the junctions may bring about harmful short-channel effects and/or parasitic capacitances. Short-channel effects may result in less well-predicted threshold voltage, larger subthreshold currents, and altered I-V characteristics.

The most widely-used device structure for achieving a doping gradient at the drain-side of channel is the lightly-doped drain ("LDD") structure. An LDD structure generally comprises a two-step implant process. The first step takes place after the formation of the gate. For an n-channel device, a relatively light implant of phosphorus is used to form the lightly doped region adjacent the channel (i.e., the LDD implant). The LDD implants are also referred to as $N^-$ and $P^-$ implants because of their lower concentrations. A conformal CVD oxide film is then deposited over the LDD implant and interposed gate. The oxide is then anisotropically removed, leaving spacers immediately adjacent sidewall surfaces of the gate conductor. After the spacers are formed, a second implant takes place at a higher dosage than the first implant. The second implant is chosen to use the same implant "type" (i.e., n or p) as the first. The higher concentration source/drain implant are also referred to as $N^+$ and $P^+$ implants. The source/drain implant is masked from areas adjacent the gate by virtue of the pre-existing spacers. Using an n-type example, the first implant (LDD implant) may use phosphorus, while the second implant (source/drain implant) uses arsenic. The spacers serve to mask the arsenic and to offset it from the gate edges. By introducing spacers after the LDD implant, the LDD structure offers a great deal of flexibility in doping the LDD area relative to the source/drain area. The LDD area is controlled by the lateral spacer dimension and the thermal drive cycle, and is made independent from the source and drain implant (second implant) depth. The conventional LDD process, however, sacrifices some device performance to improve hot-carrier resistance. For example, the LDD process exhibits reduced drive current under comparable gate and source voltages.

A thermal anneal step is required after ion implantation in order to diffuse and activate the implanted ions and repair possible implant damage to the crystal structure. An anneal can occur in a furnace or the more modem rapid-thermal-anneal ("RTA") chamber. An RTA process is typically performed at 420–1150° C. and lasts anywhere from a few seconds to a few minutes. Large area incoherent energy sources were developed to ensure uniform heating of the wafers and to avoid warpage. These sources emit radiant light which allows very rapid and uniform heating and cooling. Wafers are thermally isolated so that radiant (not conductive) heating and cooling is dominant. Various heat sources are utilized, including arc lamps, tungsten-halogen lamps, and resistively-heated slotted graphite sheets. Most heating is performed in inert atmospheres (argon or nitrogen) or vacuum, although oxygen or ammonia for growth of silicon dioxide and silicon nitride may be introduced into the RTA chamber.

The temperature and time required for an RTA are tailored to the implant type and to the implant's purpose. Dopants with a low diffusivity require higher anneal temperatures to activate and position the dopants. Dopants with a high diffusivity require lower anneal temperatures. In addition, a higher concentration of the dopants requires higher anneal temperatures. The dopants used for the LDD implants require lower temperature anneals since any additional migration of these dopants is especially harmful. Any migration towards the channel will contribute to short-channel effects and any vertical migration will increase the parasitic capacitance. In a conventional LDD, the LDD implants are performed first and any subsequent thermal anneal to activate and diffuse the subsequent source/drain implants will also thermally affect the LDD implants. A process would be desirable that could reverse the LDD formation process and enable the performance of the high-temperature thermal anneals first. This would allow a lower temperature anneal for the LDD implant which would not induce excessive migration of the dopants.

SUMMARY OF THE INVENTION

The problems outlined above are in large part solved by a transistor and a transistor fabrication method hereof. The present structure and method includes a sequence of spacers formed and partially removed upon sidewall surfaces of the gate conductor to produce a graded junction having a relatively smooth doping profile. A removable layer and a spacer are formed upon the gate conductor. The removable layer and the spacer have dissimilar etch characteristics compared to each other and compared to the gate conductor. A first dopant (medium doped drain, or "MDD" dopant) and a second dopant (source/drain dopant) are implanted into the semiconductor substrate after the formation of the removable layer and the spacer. A third dopant (LDD dopant) is implanted into the semiconductor substrate after the removable layer is at least partially removed from between the gate conductor and the spacer. As a result a graded junction is created having higher concentration regions formed outside of lighter concentration regions, relative to the channel area. Such a doping profile provides superior protection against the hot-carrier effect compared to the traditional LDD structure. In a traditional LDD structure only one such spacer is typically used and only two different dopant concentrations exist in the source/drain junction. Moreover, the conventional LDD process performs LDD implant prior to MDD and source/drain implants.

The present process of forming LDD after MDD and source/drain implants not only affords a more careful thermal budget, but also provides for a smoother doping profile. Such a profile allows for a more gradual voltage drop across the channel/drain junction. A more gradual voltage reduces $E_m$ and the hot-carrier effects associated therewith. By placing the MDD and source/drain implants before the LDD implant, a thermal advantage is achieved which allows high temperature thermal anneals to be performed first, followed by lower temperature anneals second. The high temperature thermal anneals are required to activate the high-concentration MDD and source/drain implants which are the furthest away from the channel. LDD implants closest to the channel require a lower temperature thermal anneal. If the LDD implants migrate excessively, the channel will be shortened which can give rise to harmful short-channel effects. Performing the LDD implants last avoids exposing them to high temperature cycles which would give rise to excessive migration.

According to the present process, a gate dielectric is initially grown upon a semiconductor substrate. Polysilicon is deposited across the gate dielectric and then patterned to form a gate conductor between opposed sidewall surfaces. A removable layer, comprising a material with dissimilar etch characteristics compared to the gate conductor, is formed upon the upper surface and upon the sidewall surfaces of the gate conductor. The portion of the removable layer formed upon the sidewall surfaces of the gate conductor comprises interior and exterior sidewall surfaces. In a preferred embodiment, the removable layer comprises thermally grown polysilicon oxide. In an alternative embodiment, the removable layer comprises any thin film which has an etch characteristic dissimilar from the gate conductor or adjacent spacer, such films may include, for example, chemical vapor deposited oxide or metal. A first concentration of dopants at a first energy is then implanted at a first depth into the semiconductor substrate to form MDD regions. The edges of the MDD regions are approximately aligned with the exterior sidewall surfaces of the removable layer.

A conformal layer of spacer material, with dissimilar etch characteristics compared to the removable layer, is then deposited upon the gate oxide and the removable layer. The spacer material is then anisotropically removed except upon exterior sidewall surfaces of the removable layer. As a result, spacers are formed upon the exterior sidewall surfaces of the removable layers comprising interior and exterior sidewall surfaces. In a preferred embodiment, the spacer material comprises nitride. In alternative embodiments, the spacers may comprise polysilicon or oxide. A second concentration of dopants at a second energy is then implanted into the semiconductor substrate at a second depth to form the source/drain regions. The interior edges of the source/drain regions are approximately aligned with the exterior sidewall surfaces of the spacers. Second concentration, second energy, and second depth are, respectively, greater than first dopant concentration, first energy, and first depth. A thermal anneal at a first temperature is then performed to activate first and second dopant concentrations. In a preferred embodiment, the thermal anneal is performed in an RTA chamber.

Subsequently, the removable layer is at least partially removed from the upper surface of the gate conductor and from between the gate conductor and the spacers. A wet etch is preferably used with a selectivity towards the removable layer and selectivity against the gate conductor and the spacers. In a preferred embodiment, a portion of the removable layer remains upon the gate dielectric between the gate conductor and the spacers. The remaining removable layer serves as implant protectant layer during subsequent ion implantation. A third concentration of dopants at a third energy is then implanted into the semiconductor substrate at a third depth to form lightly-doped-drain ("LDD") regions. The interior edges of the LDD regions are approximately aligned with the sidewall surfaces of the gate conductor and the exterior edges of the LDD regions are approximately aligned with the interior sidewall surfaces of the spacers.

Third concentration, third energy, and third depth are, respectively, less than first dopant concentration, first energy, and first depth. A thermal anneal at a second temperature less than the first temperature is then performed to activate the third dopant concentrations. In a preferred embodiment, the thermal anneal is performed in an RTA chamber.

BRIEF DESCRIPTION OF THE DRAWINGS

Other objects and advantages of the invention will become apparent upon reading the following detailed description and upon reference to the accompanying drawings in which:

FIG. 7 is a partial cross-sectional view of a semiconductor topography according to a processing step subsequent to FIG. 6 wherein the removable layer is at least partially removed using a wet etch;

FIG. 8 is a partial cross-sectional view of a semiconductor topography according to a processing step subsequent to FIG. 7 wherein n-type dopants are implanted into the semiconductor substrate to form LDD regions; and FIG. 9 is a partial cross-sectional view of a semiconductor topography according to a processing step subsequent to FIG. 8 wherein a thermal anneal is performed on the wafer to activate the LDD implants.

Figure 1:
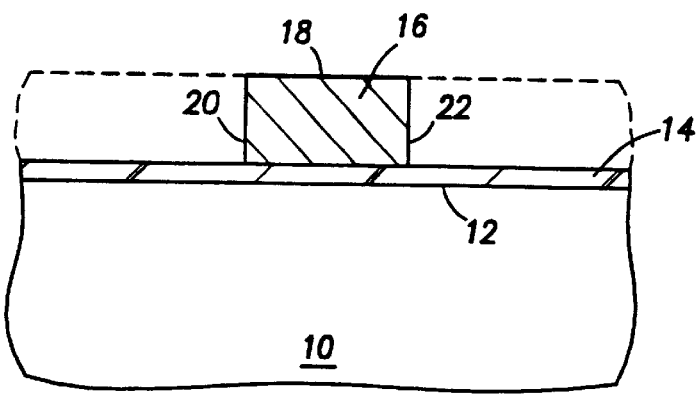
FIG. 1 is a partial cross-sectional view of a semiconductor substrate having a gate conductor formed a dielectric distance above a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 shows a partial cross-sectional view of semiconductor substrate 10 and upper surface 12 of semiconductor substrate 10. Semiconductor substrate 10 preferably comprises lightly doped n-type or p-type single-crystalline silicon having a resistivity of approximately 12 ohms-cm. Gate dielectric layer 14 is then formed upon upper surface 12 preferably by a thermal oxidation process such that gate dielectric 14 comprises silicon dioxide. Gate dielectric 14 may be formed in a thermal oxidation furnace using temperatures of approximately 700–900° C. for a relatively short (e.g., less than 60 minutes) time. Dielectric layer 14 may be grown to a thickness of approximately 15–200 Å. A polysilicon layer is then deposited upon the semiconductor topography and patterned to form gate conductor 16 with an upper surface 18 and opposing sidewall surfaces 20 and 22. The polysilicon layer is preferably deposited using a low pressure chemical vapor deposition ("CVD") process and then patterned using conventional photolithography and etching techniques.

Figure 2:
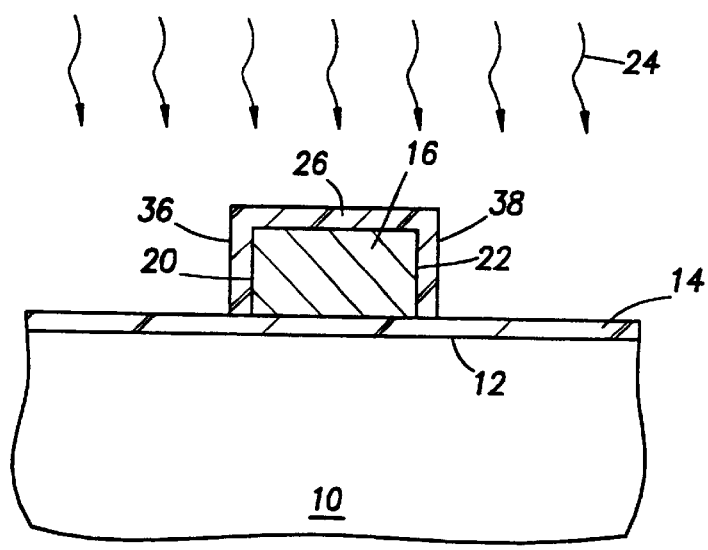
FIG. 2 is a partial cross-sectional view of a semiconductor topography according to a processing step subsequent to FIG. 1 wherein a removable layer is formed upon the exposed (upper surface and sidewall) surfaces of the gate conductor.

Turning now to FIG. 2, a process step subsequent to FIG. 1 is shown in which removable layer 26 is formed upon upper surface 18 and sidewall surfaces 20 and 22 of gate conductor 16. The portion of removable layer 26 formed upon sidewall surfaces 20 and 22 of gate conductor 16 has exterior sidewall surfaces 36 and 38. Removable layer 26 comprises a material with dissimilar etch characteristics compared to gate conductor 26 to facilitate subsequent removal of layer 26. In a preferred embodiment, removable layer 26 comprises polysilicon oxide. The polysilicon oxide may be formed in a thermal oxidation furnace using temperatures of approximately 700–900° C. or in an RTA apparatus in which the wafer is subjected to temperatures of approximately 700–1000° C. for approximately 10–30 minutes. In alternative embodiments, removable layer 26 may comprise CVD oxide, or metal, both of which have dissimilar etch characteristics compared to gate conductor 16.

Figure 3:
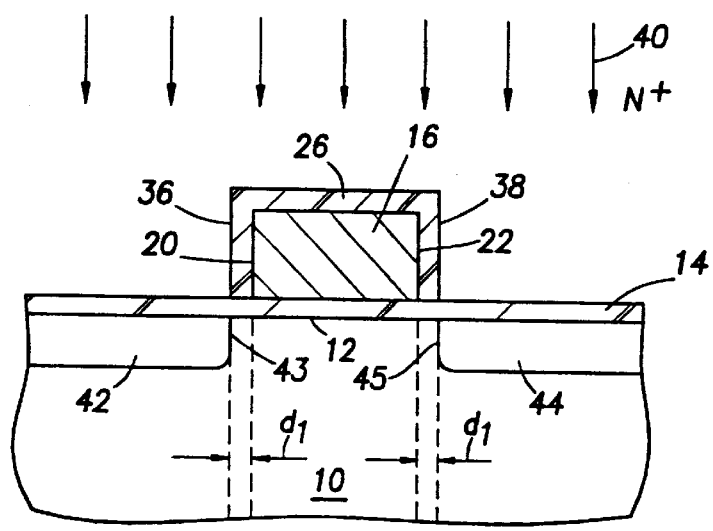
FIG. 3 is a partial cross-sectional view of a semiconductor topography according to a processing step subsequent to FIG. 2 wherein n-type dopants are implanted into the semiconductor to form MDD regions.

Turning now to FIG. 3, a process step subsequent to FIG. 2 is shown in which a first concentration of n-type (N$^+$) dopants 40 at a first energy is implanted at a first depth into semiconductor substrate 10. N$^+$ dopants preferably comprise low-diffusivity arsenic or high-diffusivity phosphorus ions or a combination of the two. A concentration of approximately $10^{14}$ ions/cm$^2$ and at an energy of approximately 10–70 keV may, for example, be used to form MDD regions 42 and 44 with edges 43 and 45, respectively. The impurities are implanted into semiconductor substrate 10 at a depth of approximately 0.10 μm. Edges 43 and 45 of MDD regions 42 and 44 are aligned with exterior sidewall surfaces 36 and 38 of removable layer 26 which are a distance $d_1$ away from sidewall surfaces 20 and 22 of gate conductor 16. This is due to masking by removable layer 26. MDD regions are placed between subsequently formed LDD regions and subsequently formed source/drain regions. MDD regions 42 and 44 provide an additional step in the doping concentration when going from the heavily doped source/drain regions to the lightly doped LDD regions. The additional step in dopant concentration provides a smoother doping profile which further reduces the voltage drop across the channel and the source/drain junction. This results in lower electric fields and a further reduction in the harmful hot-carrier effect.

Figure 4:
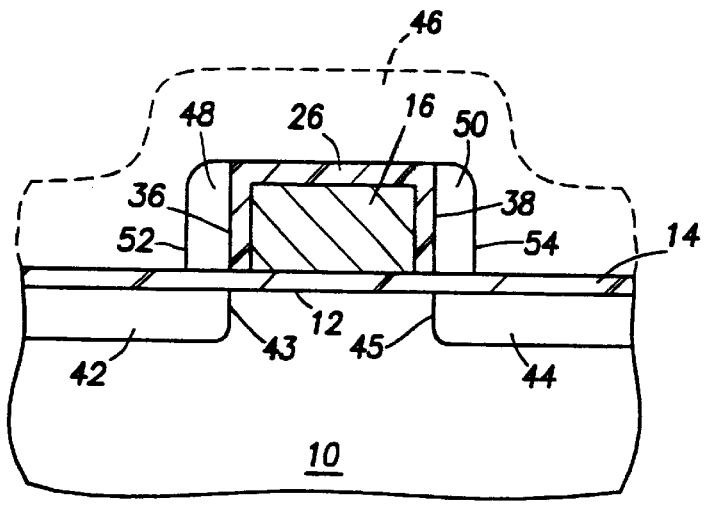
FIG. 4 is a partial cross-sectional view of a semiconductor topography according to a processing step subsequent to FIG. 3 wherein spacers are formed upon the sidewall surfaces of the removable layer.

Turning now to FIG. 4, a step subsequent to FIG. 3 is shown in which spacer material 46 is deposited across the semiconductor topography to form a conformal layer. Spacer material 46 comprises a material with dissimilar etch characteristics compared to removable layer 26. A material with such etch characteristics is chosen to facilitate removal of layer 26 during subsequent processing steps without removing the spacer material. In a preferred embodiment, spacer material 46 comprises nitride deposited using a CVD process. In alternative embodiments, spacer material 46 may comprise CVD polysilicon or metal. Alternatively, spacer material 46 may comprise any material having dissimilar etch characteristics to that of removable material 28. Spacer material 46 is subsequently anisotropically etched with a minimum overetch. An anisotropic etch removes material faster from the substantially horizontal surfaces relative to the substantially vertical surfaces. As a result, spacers 48 and 50, having substantially vertical exterior sidewall surfaces 52 and 54, are formed upon sidewall surfaces 36 and 38 of removable layer 26.

Figure 5:
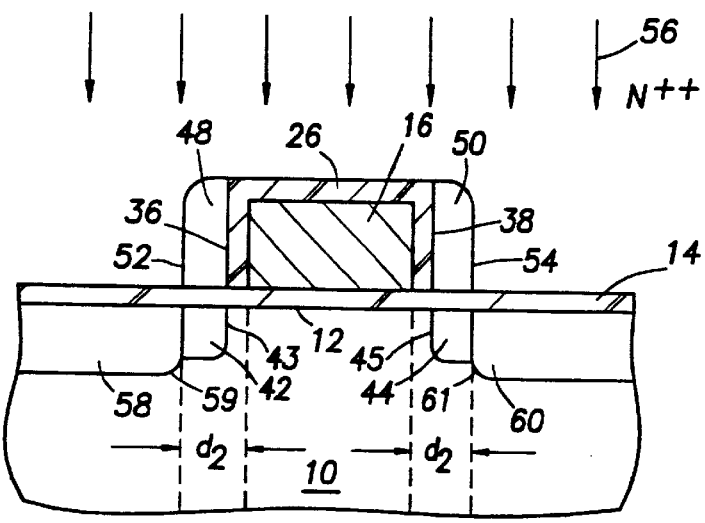
FIG. 5 is a partial cross-sectional view of a semiconductor topography according to a processing step subsequent to FIG. 4 wherein n-type dopants are implanted into the semiconductor substrate to form source/drain regions.

Turning now to FIG. 5, a processing step subsequent to FIG. 4 is shown in which a second concentration of n-type ($N^{++}$) dopants 56 at a second energy is implanted at a second depth into semiconductor substrate 10. Second dopant concentration, second energy, and second depth are, respectively, greater than first concentration, first energy, and first depth. $N^{++}$ dopants preferably comprise low-diffusivity arsenic ions. A concentration of approximately $10^{15}$ ions/cm$^2$ and at an energy of approximately 40–80 keV may, for example, be used to form source/drain regions 58 and 60 with edges 59 and 61, respectively. The dopants are implanted into semiconductor substrate 10 at a depth of approximately 0.1 to 0.2 $\mu$m. Edges 59 and 61 of source/drain regions 58 and 60 are aligned with exterior sidewall surfaces 52 and 54 of spacers 48 and 50 which are a distance $d_2$ away from sidewall surfaces 20 and 22 of gate conductor 16. This is due to masking by spacers 52 and 54. Distance $d_2$ is greater than distance $d_1$.

Figure 6:
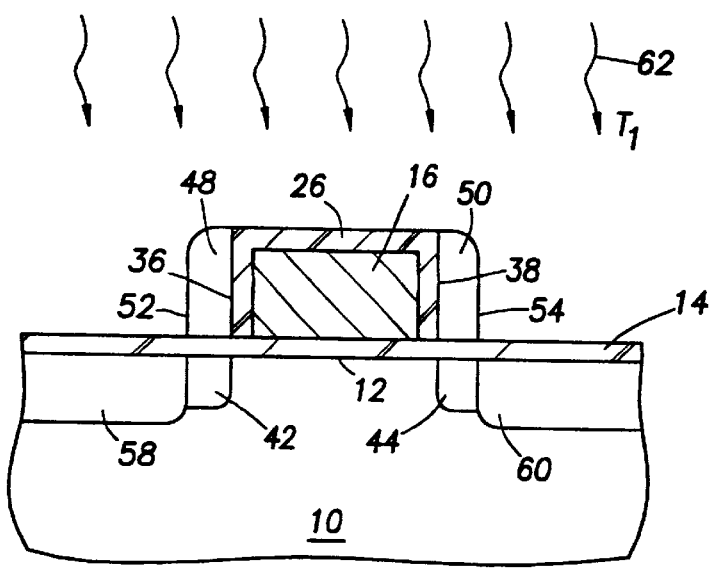
FIG. 6 is a partial cross-sectional view of a semiconductor topography according to a processing step subsequent to FIG. 5 wherein a thermal anneal is performed on the wafer to activate the MDD and source/drain implants.

Turning now to FIG. 6, a processing step subsequent to FIG. 5 is shown in which thermal anneal 56 is performed on the wafer at a first temperature $T_1$. Thermal anneal 62 is performed to activate implants in MDD regions 42 and 44 and in source/drain regions 58 and 60. In a preferred embodiment, thermal anneal 62 is performed in an RTA chamber at a temperature of approximately 950° C. for approximately 10–20 s. In an alternative embodiment thermal anneal 62 may be performed in conventional furnace. Thermal anneal 62 requires a relatively high temperature to activate the high dopant concentrations of MDD regions 42 and 44 and source/drain regions 58 and 60.

FIG. 7 illustrates a processing step in which removable layer 26 is at least partially removed. A wet etch process is preferably used. An etchant is chosen which is highly selective towards removable layer 26 and highly selective against gate conductor 16 and spacers 48 and 50. Such an etchant will remove removable layer 26 while not substantially attacking gate conductor 16 or spacers 48 and 50. Small portions 63 and 65 of removable layer 26 may remain upon gate dielectric 14 and between gate conductor 16 and spacers 48 and 50. Portions 63 and 65 are preferably used as implant protection layers (i.e., layers which prevent contaminants from entering the substrate and channeling of the implant into the substrate during subsequent implant). In addition, portions 63 and 65 help prevent silicide growth on the substrate underlying those portions. Such silicide formation would establish an electrical short between the gate conductor and the subsequently formed lightly-doped-drain regions. If removable layer 26 comprises silicon dioxide, various hydrofluoric acid solutions may be used to remove the layer. Hydrofluoric acid is typically used because it predominantly attacks silicon dioxide and not silicon or silicon nitride. Diluted hydrofluoric acid is typically used since high concentrations of the acid etch silicon dioxide too fast for good process control. For a given etchant and temperature, the etch rate depends on several other factors, such as whether the oxide was thermally grown or deposited using CVD. CVD oxide generally etches much more rapidly than thermally grown oxide, but this rate also depends on many other factors, including deposition conditions, impurity concentration, and densifying heat treatments after deposition. As a general rule, silicon dioxide films deposited at low temperatures exhibit higher etch rates than films annealed or deposited at higher temperatures. If removable layer 26 comprises nitride, an etchant selective towards nitride may be used such as phosphoric acid, provided an etch protectant is used between the polysilicon gate and the removable nitride. If removable layer is metal, then a CAROS strip could be used to selectively remove the metal as opposed to the adjoining materials.

Turning now to FIG. 8, a processing step subsequent to FIG. 7 is shown in which a third concentration of n-type ($N^-$) dopants 70 at a third energy is implanted at a third depth into semiconductor substrate 10. Third dopant concentration, third energy, and third depth are, respectively, less than first concentration, first energy, and first depth. $N^-$ dopants preferably comprise high-diffusivity phosphorus ions. A concentration of approximately $10^{13}$ ions/cm$^2$ and an energy of approximately 40–60 keV may be used, for example, to form LDD areas 66 and 68 with edges 67 and 69, respectively. The dopants are implanted into semiconductor substrate 10 at a depth of approximately 0.2 $\mu$m. Edges 67 and 69 of LDD regions 66 and 68 are aligned with exterior sidewall surfaces 20 and 22 of gate conductor 16. Edges 67 and 69 define the channel length L of the transistor. LDD regions 66 and 68, MDD regions 42 and 44, and source/drain regions 58 and 60 define a graded source/drain junction. Going from the LDD regions, to the MDD regions and to the source/drain regions, causes the dopant concentration, the depth, and the distance from the gate conductor to gradually increase. As a result, a smooth doping profile is produced which better combats hot-carrier effects than conventional LDD structures.

Turning now to FIG. 9, a processing step subsequent to FIG. 8 is shown in which thermal anneal 70 is performed on the wafer at a second temperature $T_2$. Second temperature $T_2$ is less than first temperature $T_1$. Thermal anneal 70 is performed to activate implants in LDD regions 66 and 68. Thermal anneal 70 can be performed in, for example, an RTA chamber at a temperature of approximately 950° C. for approximately 10–30 seconds. Thermal anneal 70 requires a relatively low temperature to activate the LDD regions 66 and 68. Unlike in the case of a conventional LDD structure, the high-temperature thermal anneal has already been performed. Performing such a high-temperature thermal anneal after forming the LDD implants may lead to excessive migration of the implants towards the channel. This would reduce the length of the channel which would give rise to undesirable short-channel effects. According to the present invention, the high-temperature thermal anneals required for the MDD and source/drain implants are performed prior to the LDD implants to avoid such effects.

Forming a smoother doping profile in the source/drain junctions is more desirable for an NMOS device. Arsenic is typically used as the dopant here which has a low diffusivity forming well-defined junctions and hence more abrupt doping profiles. Boron is typically used as the implant for a PMOS device which has a high diffusivity and thus naturally forms smoother doping profiles. However, a PMOS device could still benefit by the presently proposed junction formation. Thus, instead of using arsenic and phosphorous, boron may be substituted with LDD, MDD and source/drain implants formed accordingly.

It will be appreciated to those skilled in the art having the benefit of this disclosure that this invention is believed to be capable of forming junctions with a smooth doping profile, and, furthermore, performing the LDD implants last to avoid excessive migration of these implants. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A transistor, comprising:
    a gate dielectric arranged upon a semiconductor substrate;
    a gate conductor configured between opposed sidewall surfaces arranged upon a portion of said gate dielectric;
    a removable layer arranged upon and in contact with a portion of the gate dielectric and adjacent one of the sidewall surfaces of the gate conductor, wherein the removable layer comprises thermally grown silicon dioxide;
    a spacer arranged upon and in contact with a portion of the gate dielectric and adjacent the removable layer, wherein the spacer comprises deposited silicon nitride, and wherein the spacer and the gate conductor extend upward from the semiconductor substrate to a greater distance than the removable layer;
    a first dopant arranged within said semiconductor substrate primarily directly beneath said spacer;
    a second dopant arranged within said semiconductor substrate aligned outside said spacer; and
    a third dopant arranged within said semiconductor substrate primarily directly beneath the removable layer;
    wherein a concentration of said second dopant is substantially greater than a concentration of said first dopant, and wherein a concentration of said third dopant is substantially less than said concentration of said first dopant.

2. The transistor as recited in claim 1, wherein said second dopant extends into said semiconductor substrate to a greater depth than said first dopant and said third dopant.

3. The transistor as recited in claim 1, wherein said first, second and third dopants comprise a combination of low-diffusivity ions and high-diffusivity ions.

4. The transistor as recited in claim 3, wherein said low-diffusivity ions comprise arsenic ions and said high-diffusivity ions comprise phosphorus ions.

5. The transistor as recited in claim 3, wherein said third dopant comprises high-diffusivity ions and said second dopant comprises low-diffusivity ions.

6. A transistor, comprising:
    a gate conductor configured upon a gate dielectric arranged upon a semiconductor substrate;
    a removable layer arranged upon and in contact with the gate dielectric and laterally adjacent a sidewall surface of the gate conductor, wherein the removable layer is formed from a removable layer material having dissimilar etch characteristics as compared to a gate conductor material;
    a spacer arranged upon and in contact with the gate dielectric and laterally adjacent the removable layer, wherein the spacer is formed from a spacer material having dissimilar etch characteristics as compared to the removable layer material, and wherein the spacer and gate conductor extend upward from the semiconductor substrate to a greater distance than does the removable layer;
    a first dopant region arranged within the semiconductor substrate primarily directly beneath the spacer;
    a second dopant region arranged within the semiconductor substrate, laterally adjacent said first dopant region, and aligned with an exposed outer surface of the spacer; and
    a third dopant region arranged within the semiconductor substrate primarily directly beneath the removable layer;
    wherein a concentration of said second dopant is substantially greater than a concentration of said first dopant, and wherein a concentration of said third dopant is substantially less than said concentration of said first dopant.

7. The transistor as recited in claim 6, wherein said removable layer comprises silicon dioxide.

8. The transistor as recited in claim 6, wherein said spacer comprises silicon nitride.

9. The transistor as recited in claim 6, wherein said removable layer comprises a metal.

10. The transistor as recited in claim 6, wherein said first, second and third dopant regions comprise a combination of low-diffusivity ions and high-diffusivity ions.

11. The transistor as recited in claim 10, wherein said low-diffusivity ions comprise arsenic ions and said high-diffusivity ions comprise phosphorus ions.

12. The transistor as recited in claim 10, wherein said third dopant region comprises high-diffusivity ions and said second dopant region comprises low-diffusivity ions.

13. A transistor, comprising:
    a gate conductor configured upon a gate dielectric arranged upon a semiconductor substrate;
    a removable layer arranged upon and in contact with the gate dielectric and laterally adjacent a sidewall surface of the gate conductor, wherein the removable layer is formed from a removable layer material having dissimilar etch characteristics as compared to a gate conductor material;
    a spacer arranged upon and in contact with the gate dielectric and laterally adjacent the removable layer such that a trench is configured between the spacer and the gate conductor, wherein the trench is bounded by a portion of the sidewall surface of the gate conductor, an exposed gate-facing lateral surface of the spacer, and an exposed upper surface of the removable layer, and wherein the spacer is formed from a spacer material having dissimilar etch characteristics as compared to the removable layer material;
    a first dopant region arranged within the semiconductor substrate primarily directly beneath the spacer;
    a second dopant region arranged within the semiconductor substrate, laterally adjacent said first dopant region, and aligned with an exposed outer surface of the spacer; and
    a third dopant region arranged within the semiconductor substrate primarily directly beneath the removable layer;
    wherein a concentration of said second dopant is substantially greater than a concentration of said first dopant, and wherein a concentration of said third dopant is substantially less than said concentration of said first dopant.

14. The transistor of claim 13, wherein said removable layer comprises silicon dioxide.

15. The transistor of claim 13, wherein said removable layer comprises a metal.

16. The transistor of claim 13, wherein said spacer comprises silicon nitride.

17. The transistor of claim 13, wherein said first, second and third dopant regions comprise a combination of low-diffusivity ions and high-diffusivity ions.

18. The transistor as recited in claim 17, wherein said low-diffusivity ions comprise arsenic ions and said high-diffusivity ions comprise phosphorus ions.

19. The transistor as recited in claim 17, wherein said third dopant region comprises high-diffusivity ions and said second dopant region comprises low-diffusivity ions.

* * * * *